United States Patent
Shih et al.

(10) Patent No.: US 10,976,674 B2
(45) Date of Patent: Apr. 13, 2021

(54) METHOD FOR DETECTING EUV PELLICLE RUPTURE

(71) Applicant: TAIWAN SEMICONDUCTOR MANUFACTURING CO., LTD., Hsinchu (TW)

(72) Inventors: Chih-Tsung Shih, Hsinchu (TW); Bo-Tsun Liu, Taipei (TW); Tsung Chuan Lee, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/540,874

(22) Filed: Aug. 14, 2019

(65) Prior Publication Data

US 2020/0057383 A1 Feb. 20, 2020

Related U.S. Application Data

(60) Provisional application No. 62/719,299, filed on Aug. 17, 2018.

(51) Int. Cl.
*G03F 7/20* (2006.01)

(52) U.S. Cl.
CPC ........ *G03F 7/7085* (2013.01); *G03F 7/70908* (2013.01); *G03F 7/70983* (2013.01)

(58) Field of Classification Search
CPC ...... G03F 1/62; G03F 7/7085; G03F 7/70983; G03F 1/142; G03F 1/84; G03F 7/70916
See application file for complete search history.

(56) References Cited

U.S. PATENT DOCUMENTS

| | | | |
|---|---|---|---|
| 5,943,130 A | 8/1999 | Bonin et al. | |
| 7,087,914 B2 | 8/2006 | Akins et al. | |
| 7,362,413 B2 | 4/2008 | Kremer et al. | |
| 9,131,917 B2 | 9/2015 | Telfort et al. | |
| 9,164,399 B2 | 10/2015 | Wang et al. | |
| 9,268,241 B2 | 2/2016 | Lansbergen et al. | |
| 10,209,635 B2 | 2/2019 | Kochersperger et al. | |
| 2006/0066834 A1 | 3/2006 | Phillips et al. | |
| 2007/0002516 A1* | 1/2007 | Matsumoto | G03F 1/66 361/234 |
| 2011/0014577 A1* | 1/2011 | Hashimoto | G03F 7/70983 430/325 |
| 2011/0032505 A1 | 2/2011 | Lansbergen et al. | |
| 2018/0314150 A1 | 11/2018 | Brouns et al. | |
| 2018/0364561 A1* | 12/2018 | Vles | G03F 7/7085 |
| 2019/0235392 A1* | 8/2019 | Jeunink | G03F 7/7085 |

OTHER PUBLICATIONS

Dan Smith, "ASML NXE Pellicle progress update," SPIE Advanced Lithography 9776-1, Feb. 22, 2016, San Jose California.
Anthony Garetto et al., "Status of the AIMS EUV Development Project," Proc. of SPIE, 29th European Mask and Lithography Conference, vol. 8886, pp. 888601-1 to 888601-6 (2013).

* cited by examiner

*Primary Examiner* — Steven Whitesell Gordon
(74) *Attorney, Agent, or Firm* — McDermott Will & Emery LLP

(57) ABSTRACT

An extreme ultraviolet (EUV) lithography system includes an extreme ultraviolet (EUV) radiation source to emit EUV radiation, a collector for collecting the EUV radiation and focusing the EUV radiation, a reticle stage for supporting a reticle including a pellicle for exposure to the EUV radiation, and at least one sensor configured to detect particles generated due to breakage of the pellicle.

20 Claims, 7 Drawing Sheets

METHOD FOR DETECTING EUV PELLICLE RUPTURE

CROSS REFERENCE TO RELATED APPLICATION

This application claims priority of U.S. Provisional Patent Application No. 62/719,299 filed on Aug. 17, 2018, the entire contents of which are incorporated herein by reference.

BACKGROUND

A lithographic apparatus may for example project a pattern from a patterning device (e.g., a photo mask) onto a layer of radiation-sensitive material (resist) provided on the semiconductor substrate.

The patterning device (photo mask) is protected from particle contamination by a pellicle. A pellicle is a thin transparent film stretched over a frame that is positioned over one side of the photo mask to protect the photo mask from damage, dust and/or moisture. In EUV lithography, a pellicle having a high transparency in the EUV wavelength region, a high mechanical strength and a low thermal expansion is generally required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
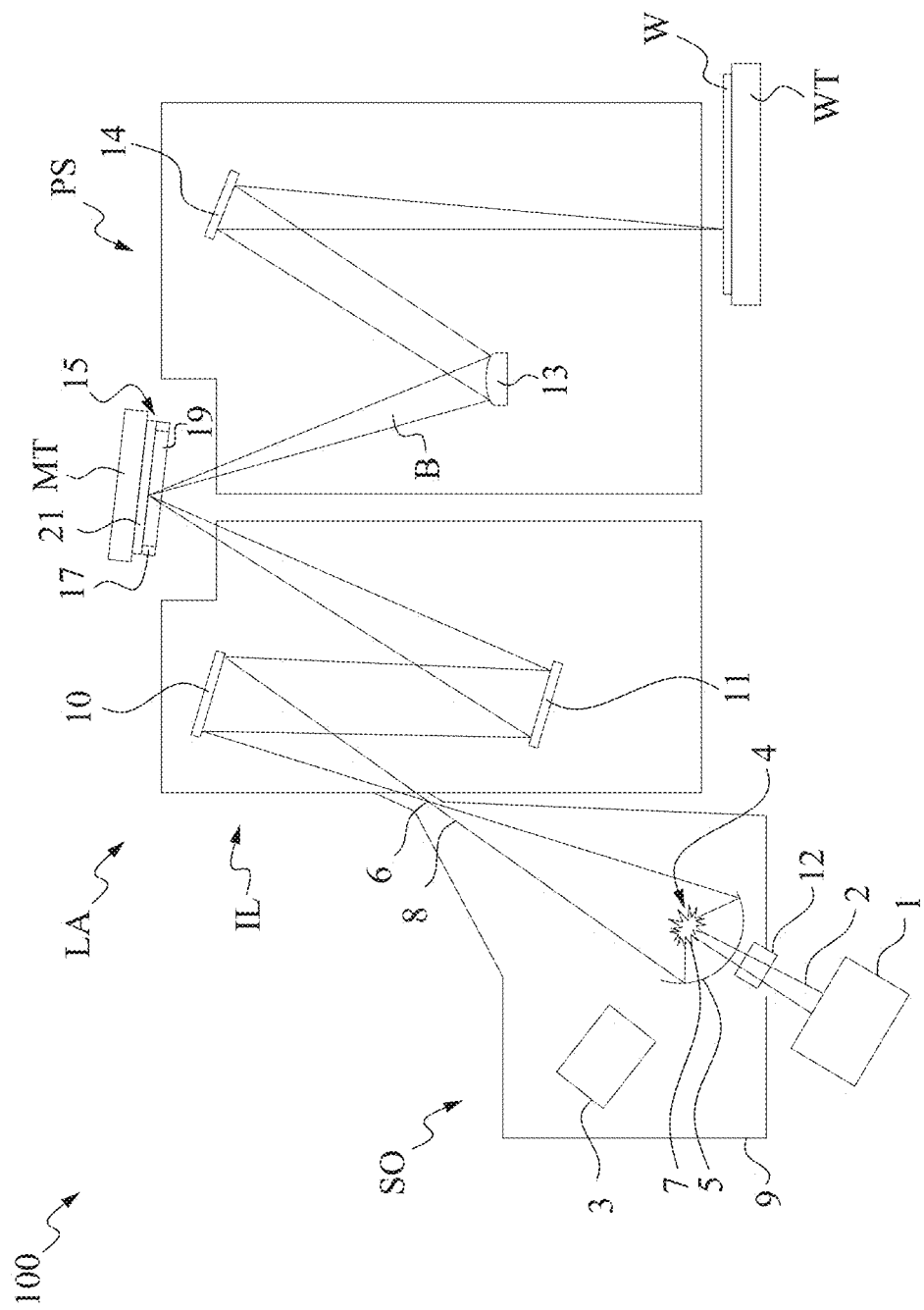
FIG. 1 shows an extreme ultraviolet lithography exposure system, according to example embodiments.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in between the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained.

Embodiments disclosed herein are directed to detecting a break (or rupture) in a in a lithography system, such as an extreme ultraviolet (EUV) lithography system.

The need for protection from particulate matter (i.e., dust, dirt, etc.) contaminating objects of interest is required in many fields of application, including applications in semiconductor manufacturing such as extreme ultraviolet lithography. A lithographic apparatus may for example project a pattern from a patterning device (e.g., a photo mask) onto a layer of radiation-sensitive material (resist) provided on the semiconductor substrate. The wavelength of radiation used by a lithographic apparatus to project a pattern onto a substrate determines the minimum size of features that can be formed on that substrate. A lithographic apparatus that uses extreme ultraviolet radiation, being electromagnetic radiation having a wavelength within the range 4-20 nm, may be used to form smaller features on a substrate than a conventional lithographic apparatus (which may for example use electromagnetic radiation with a wavelength of 193 nm).

The patterning device (photo mask) is protected from particle contamination by a pellicle. The pellicle is located away from the patterning device and is out of the focal plane of a lithographic apparatus in use. Because the pellicle is out of the focal plane of the lithographic apparatus, contamination particles which land on the pellicle are out of focus in the lithographic apparatus. Consequently, images of the contamination particles are not projected onto the substrate. If the pellicle were not present, then a contamination particle which landed on the patterning device would be projected onto the substrate and would introduce a defect into the projected pattern.

It is desirable to minimize pellicle breakage and, if the pellicle breaks, to limit the contamination of the extreme ultraviolet lithography system because of the damaged pellicle. One way to detect pellicle breakage is by visually inspecting a reticle in the load lock chamber of the extreme ultraviolet lithography system. The reticle can be visually inspected (e.g., by an operator) to check if a pellicle is present on the reticle and to ensure if the pellicle is damaged.

Since the load lock chamber is the first stage of the extreme ultraviolet lithography system, by confirming the state of the pellicle in the load lock chamber, contamination of the later stages of the extreme ultraviolet lithography system due to a damaged pellicle can be limited.

Another way to minimize pellicle breakage is by controlling the rate at which air is removed from the lithographic apparatus to create a low pressure (e.g., near vacuum) environment in the extreme ultraviolet lithography system. By controlling the rate at which the pressure is lowered, stress acting on the pellicle can be minimized and chances of pellicle breakage are mitigated.

Pellicle damage can also be limited by optimizing the flow of gas (e.g., hydrogen, helium, nitrogen, oxygen or argon) adjacent the pellicle during reticle exposure. The gas is injected into a space between the reticle (having the pellicle installed thereon) and one or more reticle masking (REMA) blades. One other way to limit pellicle damage is by adjusting the EUV power during exposure. This may include decreasing the EUV power (e.g., from about 215 W to about 80 W) such that a reduced power EUV radiation is incident on the pellicle.

Occasionally, the pellicle breaks or ruptures and this causes the particles of the pellicle to be dispersed in the lithography system. The particles contaminate the environment of the lithography system and introduce defects into the pattern projected on the semiconductor substrate. In existing methods, pellicle damage is detected only during exposure of the pellicle to extreme ultraviolet light by measuring the optical intensity of the EUV radiation using an optical intensity sensor. Thus, existing methods can be performed only at the reticle stage of the extreme ultraviolet lithography system where the reticle is exposed to extreme ultraviolet (EUV) radiation. As a result, if the pellicle were to break in the stages of the lithography system preceding the EUV exposure stage, then it would not be possible to detect the pellicle damage. Such a damaged pellicle would then travel through the lithography system to the EUV exposure stage, and particles from the damaged pellicle may contaminate all the stages of the lithography system the damaged pellicle passes through.

It is desirable to detect pellicle breakage/rupture earlier in the manufacturing process since once the pellicle is broken, the cleanup and restore operations for bringing the extreme ultraviolet lithography system back online requires a relatively long time (around 9 days).

Embodiments disclosed are directed to an extreme ultraviolet lithography system that includes one or more sensors in one or more stages of the extreme ultraviolet lithography system in addition to the one or more sensors in the EUV exposure stage of the extreme ultraviolet lithography system.

FIG. 1 shows an extreme ultraviolet lithography exposure system 100, according to example embodiments. The extreme ultraviolet lithography exposure system 100 includes a radiation source SO and a lithographic apparatus LA. The radiation source SO is configured to generate an extreme ultraviolet (EUV) radiation beam B. The lithographic apparatus LA comprises an illumination system IL, a reticle support structure MT, a projection system PS, and a substrate table WT configured to support a substrate W. The illumination system IL is configured to condition the radiation beam B before it is incident upon a patterning device 21 which is alternatively referred to as a mask or a reticle (hereinafter, referred to as reticle 21). The support structure MT includes for example, a chuck for supporting the reticle 21. The projection system PS is configured to project the radiation beam B (now patterned by the reticle 21) onto the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in the illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type that may be referred to as a laser produced plasma (LPP) source. A laser 1, which may for example be a CO2 laser, is arranged to deposit energy via a laser beam 2 into a target droplet, such as tin (Sn) that is provided from a target droplet generator 3. Although tin is referred to in the following description, any suitable target droplet material may be used. The target droplet material may for example be in liquid form, and may for example be a metal or alloy. The target droplet generator 3 may comprise a nozzle configured to direct tin, for example, in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a collector). The collector 5 may have a multilayer structure that is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

In other embodiments, the collector 5 includes a grazing incidence collector that is configured to receive EUV radiation at grazing incidence angles and focus the EUV radiation at an intermediate focus. A grazing incidence collector may, for example, be a nested collector, comprising a plurality of grazing incidence reflectors. The grazing incidence reflectors may be disposed axially symmetrically around an optical axis.

The radiation source SO includes one or more contamination traps (not shown). For example, a contamination trap is located between the plasma formation region 4 and the radiation collector 5. The contamination trap is for example a rotating foil trap, or any other suitable form of contamination trap.

The laser 1 is separated from the radiation source SO in some embodiments. Where this is the case, the laser beam 2 is passed from the laser 1 to the radiation source SO with the aid of a beam delivery system (not shown) comprising, for example, suitable directing mirrors and/or a beam expander, and/or other optics. The laser 1 and the radiation source SO are together considered to be a radiation source system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused is referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL includes a facetted field mirror device 10 and a faceted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the reticle 21 held by the support structure MT. The reticle 21 is protected by a pellicle 19, which is held in place by a pellicle frame 17. The assembly including the support structure MT, the reticle 21, the pellicle 19, and the pellicle frame 17 together form the reticle stage (RS). The reticle 21 reflects and patterns the radiation beam B. The illumination system IL includes other mirrors or devices in addition to or instead of the faceted field mirror device 10 and faceted pupil mirror device 11.

Following reflection from the reticle 21 the patterned radiation beam B enters the projection system PS. The projection system comprises a plurality of mirrors that are configured to project the radiation beam B onto a semiconductor substrate W held by the substrate table WT. In some embodiments, the projection system PS applies a reduction factor to the radiation beam, forming an image with features that are smaller than corresponding features on the reticle 21. Although the projection system PS has two mirrors in FIG. 1, the projection system may include any number of mirrors (e.g. six mirrors).

The lithographic apparatus LA may, for example, be used in a scan mode, wherein the support structure (e.g. mask table or chuck) MT and the substrate table WT are scanned synchronously while a pattern imparted to the radiation beam is projected onto a substrate W (i.e. a dynamic exposure). The velocity and direction of the substrate table WT relative to the support structure (e.g. mask table) MT is determined by the demagnification and image reversal characteristics of the projection system PS. The patterned radiation beam that is incident upon the substrate W comprises a band of radiation. The band of radiation is referred to as an exposure slit. During a scanning exposure, the movement of the substrate table WT and the support structure MT is such that the exposure slit travels over an exposure field of the substrate W.

The radiation source SO and/or the lithographic apparatus that is shown in FIG. 1 may include components that are not illustrated. For example, a spectral filter is provided in the radiation source SO in some embodiments. The spectral filter is substantially transmissive for EUV radiation but substantially blocking for other wavelengths of radiation such as infrared radiation.

In other embodiments of the lithographic system, the radiation source SO includes one or more free electron lasers. The one or more free electron lasers are configured to emit EUV radiation that is provided to one or more lithographic apparatus.

The pellicle assembly 15 includes a pellicle 19 that is provided adjacent to the reticle 21. The pellicle 19 is provided in the path of the radiation beam B such that radiation beam B passes through the pellicle 19 both as it approaches the reticle 21 from the illumination system IL and as it is reflected by the reticle 21 towards the projection system PS. The pellicle 19 comprises a thin film that is substantially transparent to EUV radiation (although a small amount of EUV radiation may be absorbed). The pellicle 19 protects the reticle 21 from particle contamination.

Whilst efforts may be made to maintain a clean environment inside the lithographic apparatus LA, particles may still be present inside the lithographic apparatus LA. In the absence of a pellicle 19, particles may be deposited onto the reticle 21. Particles on the reticle 21 may disadvantageously affect the pattern that is imparted to the radiation beam B and the pattern that is transferred to the substrate W. The pellicle 19 advantageously provides a barrier between the reticle 21 and the environment in the lithographic apparatus LA in order to prevent particles from being deposited on the reticle 21.

The pellicle 19 is positioned at a distance from the reticle 21 that is sufficient that any particles that are incident upon the surface of the pellicle 19 are not in the focal plane of the radiation beam B. This separation between the pellicle 19 and the reticle 21, acts to reduce the extent to which any particles on the surface of the pellicle 19 impart a pattern to the radiation beam B. It will be appreciated that where a particle is present in the beam of radiation B, but at a position that is not in a focal plane of the beam of radiation B (i.e., not at the surface of the reticle 21), then any image of the particle will not be in focus at the surface of the substrate W. In some embodiments, the separation between the pellicle 19 and the reticle 21 may, for example, be between about 2 mm and about 3 mm (e.g. about 2.5 mm).

Figure 2:
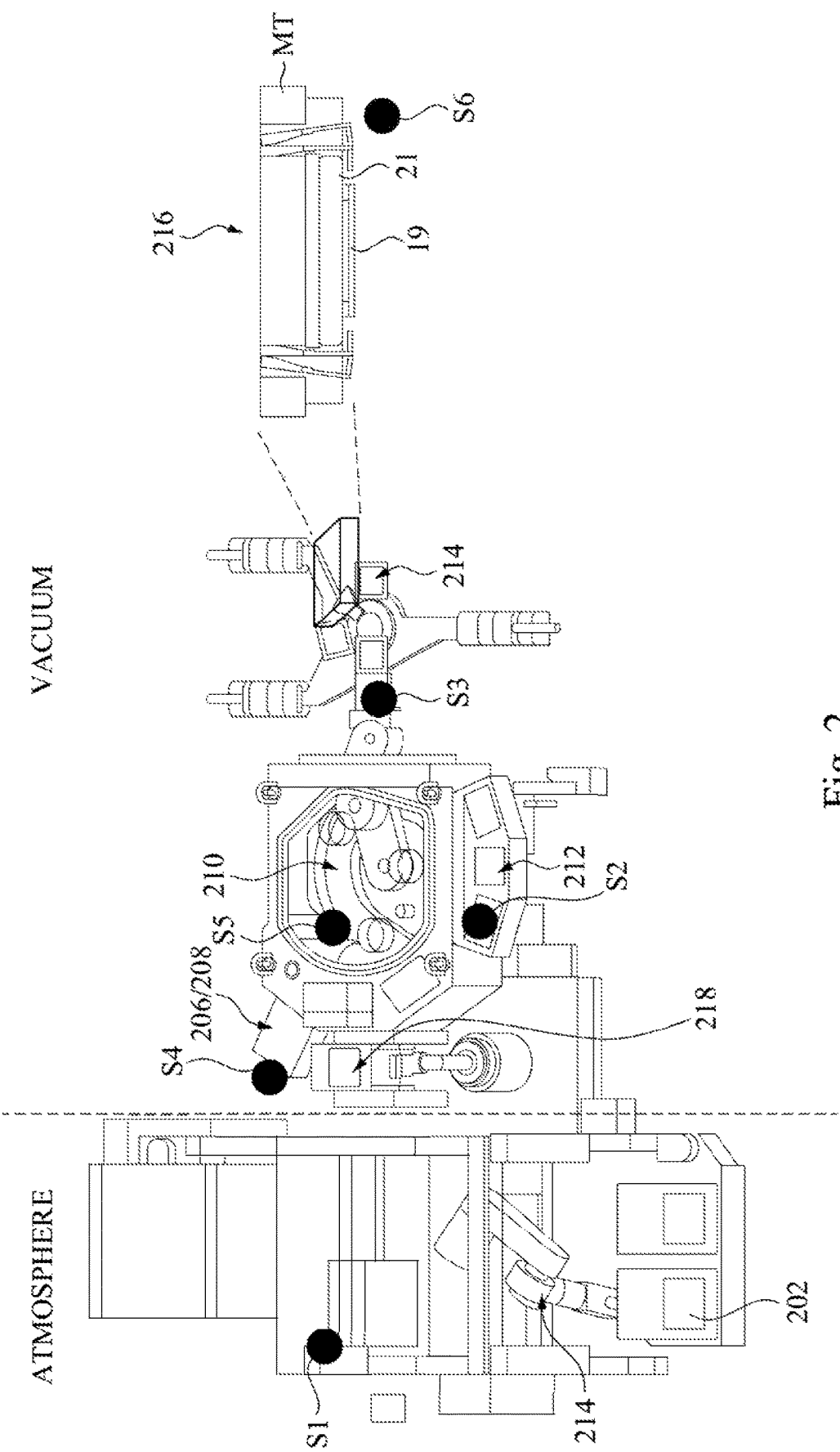
FIG. 2 illustrates a top view of an exemplary layout of different stages (or stations) with an extreme ultraviolet lithography system, according to example embodiments.

FIG. 2 illustrates a top view of an exemplary layout of different stages (or stations) with an extreme ultraviolet lithography system 200, according to example embodiments. As illustrated the extreme ultraviolet lithography system 200 includes a load port 202, an out of vacuum robot (OVR) 204, a reticle backside inspection (RBI) stage 206, a barcode reader 208, an in-vacuum robot (IVR) 210, an in-vacuum library (IVL) 212, a rapid exchange device (RED) 214, and a reticle stage (RS) 216 (similar to the reticle stage in FIG. 1). The load port 202 and the out of vacuum robot (OVR) 204 are located in an atmospheric pressure environment while the reticle backside inspection (RBI) stage 206, the barcode reader 208, the in-vacuum robot (IVR) 210, the in-vacuum library (IVL) 212, the rapid exchange device (RED) 214, and the reticle stage (RS) 216 are located in a vacuum environment. Access between the vacuum environment and the atmospheric pressure environment is controlled by a load lock chamber 218. For instance, the load lock chamber 218 is located between the out of vacuum robot (OVR) 204 and the in-vacuum library (IVL) 212. A reticle in the load lock chamber 218 can be visually inspected (e.g., by an operator) to check if a pellicle is present on the reticle and to ensure if the pellicle is ruptured. Since the load lock chamber 218 is the first stage of the extreme ultraviolet lithography system 200, by confirming the state of the pellicle in the load lock chamber 218 contamination of the extreme ultraviolet lithography system 200 due to a damaged pellicle can be mitigated.

The load port 202 serves as an entry point to the extreme ultraviolet lithography system 200 via which a reticle (e.g., reticle 21 in FIG. 1) is introduced into the extreme ultraviolet lithography system 200. In an embodiment, the reticle 21 including the pellicle 19 is enclosed within a clean filter pod (CFP) which in turn is enclosed in a reticle carrier, also known as a reticle standard manufacturing interface ("SMIF") pod, or RSP. The reticle standard manufacturing interface pod permits handling and transportation of the reticle 21 outside of the lithographic apparatus LA. The reticle standard manufacturing interface pod is shaped and sized (or otherwise configured) to be received into the load port 202.

In some embodiments, adjacent to the load port 202 is a RSP library. In some embodiments, reticle standard manufacturing interface pod is placed by load port 202 into RSP library. The RSP library is a repository or storage for multiple reticle standard manufacturing interface pods each including a reticle. When a particular reticle is required, the reticle standard manufacturing interface pod containing the required reticle is retrieved from the RSP library.

In some embodiments, the out of vacuum robot (OVR) 204 retrieves the reticle standard manufacturing interface pod containing the required reticle for providing the reticle to the load lock chamber 218. In some embodiments, the out of vacuum robot (OVR) 204 is also configured to open the reticle standard manufacturing interface pod and remove the clean filter pod including the reticle. A vacuum pump is connected to load lock chamber 218 and forms a vacuum environment inside load lock chamber 218. The load lock chamber 218 is sandwiched by two valves for controlling the pressure in the load lock chamber 218 The load lock chamber 218 provides an interface between the stages of the extreme ultraviolet lithography system 200 at atmospheric pressure and the stages of the extreme ultraviolet lithography system 200 in vacuum, such that extreme ultraviolet lithography mask can be transferred between atmospheric pressure condition and vacuum condition.

The reticle backside inspection (RBI) stage 206 is located adjacent the load lock chamber 218 and includes the equipment to measure and clean the backside of the reticle 21 to limit the particles on the backside of the reticle 21. In an embodiment, the reticle backside inspection (RBI) stage 206 includes one or more of an optical system for detecting particles on the backside of the reticle 21, a measuring system for measuring size of the particles, a cleaning system for cleaning the backside of the reticle 21, and an inspection system for inspecting the backside of the reticle 21. The reticle 21 must be kept very flat when attached to support structure MT of the reticle stage 216. Therefore, it is also important to prevent relatively large particles, (e.g., 1 µm), or layers of smaller particles from migrating to the backside of reticle 21, which is the surface of the reticle 21 that contacts the support structure MT. Particles on the backside can distort the reticle 21 and cause focusing and overlay errors. The backside particles can also migrate to the support structure MT and cause similar problems for all subsequent reticles that are handled by the support structure MT. The barcode reader 208 identifies the reticle 21 and the pattern formed thereon.

The in-vacuum robot (IVR) 210 is located adjacent the load lock chamber 218 and operates to transport the reticle 21 (or, as the case may be, the reticle standard manufacturing interface pod including clean filter pod, or the clean filter pod if removed by the out of vacuum robot 204) from the load lock chamber 218 to the in-vacuum library (IVL) 212 for temporarily storing the reticle 21 before use. In some embodiments, when the particular reticle is needed, the in-vacuum robot (IVR) 210 retrieves the desired reticle from the in-vacuum library (IVL) 212 and provides the reticle to the rapid exchange device (RED) 214. In some other embodiments, the rapid exchange device (RED) 214 retrieves the desired reticle from the in-vacuum library (IVL) 212.

During manufacture of integrated circuits using a lithographic apparatus, different reticles are used to generate different circuit patterns to be formed on different layers in the integrated circuit. Thus, during the manufacturing different layers of the integrated circuit the different reticles must be changed. The rapid exchange device (RED) 214 (also referred to as a reticle exchange device) is used to change reticles during the lithography process in the least possible amount of time.

The reticle stage 216 is similar to the reticle stage illustrated in FIG. 1. As illustrated, the reticle stage 216 includes a support structure MT, which, for example, is a chuck, for securing the reticle 21 in place during the lithography process. The pellicle 19 is positioned over the reticle 21 to protect the reticle 21 from particles, dust, damage and/or contamination.

Occasionally, the pellicle 19 breaks or ruptures and this causes the particles of the pellicle 19 to be dispersed in the extreme ultraviolet lithography system 200. The pellicle 19 may break at any of the different stages of the extreme ultraviolet lithography system 200, for example, during handling at a stage or during transportation between different stages. When the pellicle 19 breaks, the entire extreme ultraviolet lithography system 200 is shut down to perform cleanup operation before bringing the extreme ultraviolet lithography system 200 back in operation. The cleanup operation takes a relatively long time (around 9 days). It is desirable to detect pellicle breakage/rupture earlier in the manufacturing process and thereby limit contamination of the extreme ultraviolet lithography system 200. For instance, it is desirable to detect pellicle breakage at the out of vacuum robot 204. By doing so, contamination is localized. If the pellicle breakage is detected only at the reticle stage 216 and if the pellicle breaks at one or more of the preceding stages including the out of vacuum robot (OVR) 204, the reticle backside inspection (RBI) stage 206, the barcode reader 208, the in-vacuum robot (IVR) 210, the in-vacuum library (IVL) 212, or the rapid exchange device (RED) 214, then the breakage cannot be detected till the pellicle has arrived at the reticle stage 216. As a result, multiple stages of the extreme ultraviolet lithography system 200 are contaminated by the pellicle particles. On the other hand, if the pellicle breakage is detected at one or more of the preceding stages, then the pellicle can be prevented from travelling to the subsequent stages and thus limit contamination of the subsequent stages.

A variety of sensors are used to detect the particles from the damaged pellicle 21. The sensor is placed adjacent a location at which particles are to be detected. As illustrated, in the extreme ultraviolet lithography system 200, sensors S1, S2, S3, S4, S5, and S6 are positioned at or adjacent one or more of the out of vacuum robot (OVR) 204, the reticle backside inspection (RBI) stage 206, the barcode reader 208, the in-vacuum robot (IVR) 210, the in-vacuum library (IVL) 212, and the rapid exchange device (RED) 214 of the extreme ultraviolet lithography system 200. While a single sensor S4 is illustrated for the reticle backside inspection (RBI) stage 206 and the barcode reader 208, each of the reticle backside inspection (RBI) stage 206 and the barcode reader 208 can be provided with an individual sensor. In other embodiments, a single sensor can be provided for all of the reticle backside inspection (RBI) stage 206, the barcode reader 208, the in-vacuum robot (IVR) 210, and the in-vacuum library (IVL) 212. Although not illustrated, sensors can also be provided for the load lock chamber 218. Each sensor is triggered (or activated) upon detecting particles generated by a ruptured pellicle. Thus, sensors are triggered based on the location of the reticle having the ruptured pellicle. For instance, if the reticle with the ruptured pellicle is at or adjacent the out of vacuum robot (OVR) 204, then sensor S1 will be triggered. If such a reticle with the ruptured pellicle were to be transported to the in-vacuum library (IVL) 212, the sensor S2 will be triggered. In addition, sensors S4 and S5, located at or adjacent the reticle backside inspection (RBI) stage 206, the barcode reader 208, and the in-vacuum robot (IVR) 210, will be triggered if the sensors S4 and S5 detect the pellicle particles as the reticle is transported to the in-vacuum library (IVL) 212. Thus, it will be understood that the sensors are triggered as the reticle with the damaged pellicle travels through the extreme ultraviolet lithography system 200. In some embodiments, other sensors in the vicinity of a triggered sensor are also activated. Thus, referring to FIG. 2, in some embodiments, if sensor S2 is triggered, then sensors S4 and S5 are also triggered since the sensors S4 and S5 are in the vicinity of sensor S2. In other embodiments, the other sensors are triggered in a desired sequence.

In some embodiments, the sensors S1, S2, S3, S4, S5, and S6 are particle counters configured to detect particles that are generated by the damaged pellicle 21.

Figure 3:
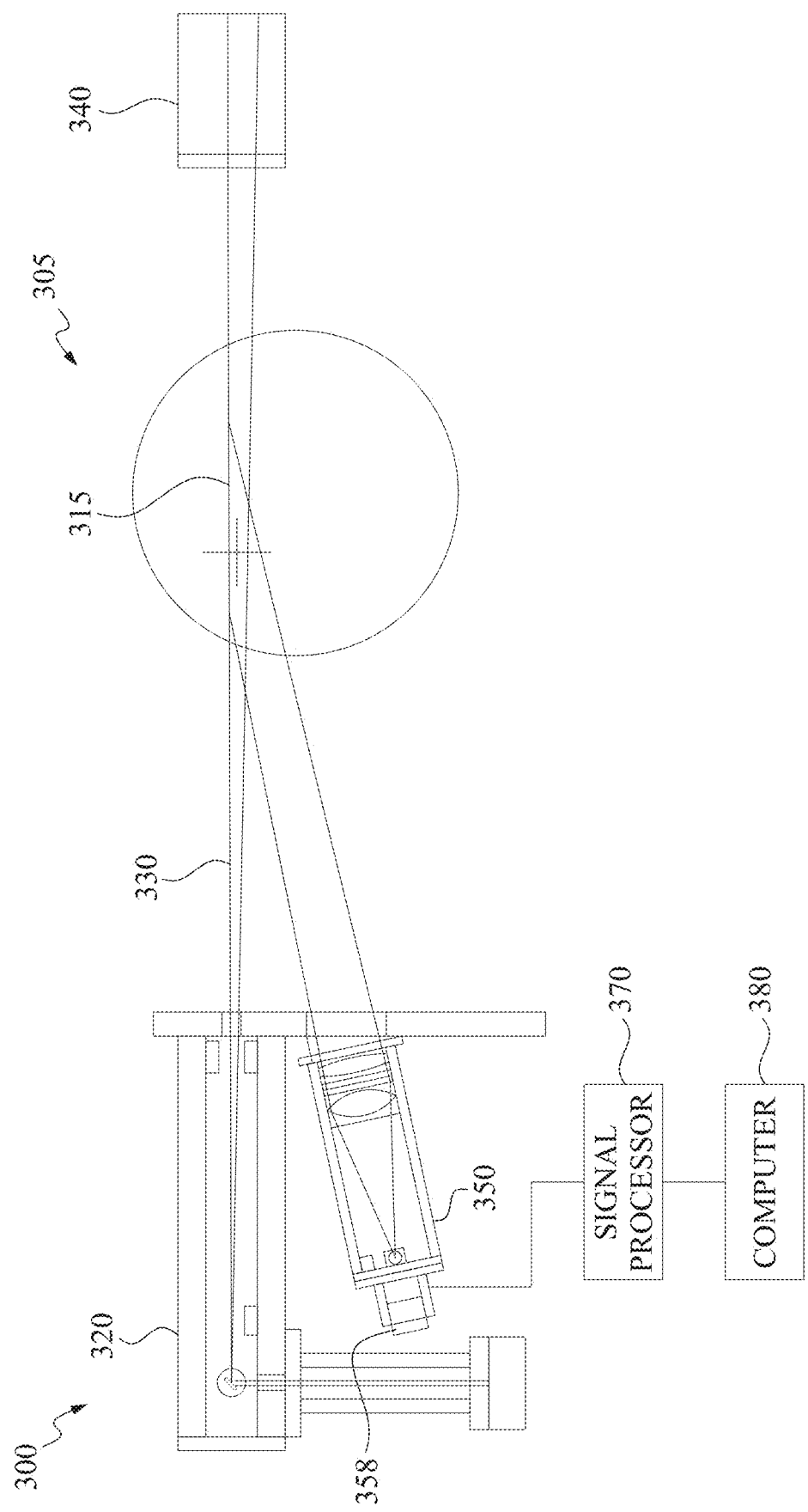
FIG. 3 schematically illustrates a particle counter, according to example embodiments.

FIG. 3 schematically illustrates a particle counter 300, according to example embodiments. The sensors S1, S2, S3, S4, S5, and S6 are similar to the particle counter 300. The particle counter 300 is located at or adjacent the location at which the particles are to be detected. As illustrated, the particle counter includes a transmitter 320 that scans a laser beam 330 across a measurement volume 315 adjacent to (or otherwise in the vicinity of) a location, generally indicated by 305, at which the particles are to be detected. The measurement volume 315 indicates a general space or region where particles generated by a damaged pellicle are measured. The particle counter 300 is arranged in the extreme ultraviolet lithography system 200 such that particles from the ruptured pellicle occupy the measurement volume 315 and are thereby detected. The particle counter 300 is arranged at or adjacent one or more of the out of vacuum robot (OVR) 204, the reticle backside inspection (RBI) stage 206, the barcode reader 208, the in-vacuum robot (IVR) 210, the in-vacuum library (IVL) 212, the rapid exchange device (RED) 214, and the reticle stage (RS) 216 such that particles generated from a ruptured pellicle occupy the measurement volume 315.

The particle counter 300 also includes a detector 350 that collects light which is scattered by particles in measurement volume 315. The laser beam 330 is scanned over the measurement volume 315 to detect the particles. By controlling the range of motion of laser beam 330, the size of measurement volume 315 can be increased or decreased. In addition, the size of measurement volume 315 can be controlled by varying the diameter of laser beam 330 and the size of an aperture in detector 350, among other things. In some embodiments, particles are counted (See below) without interfering with the operation of the out of vacuum robot (OVR) 204, the reticle backside inspection (RBI) stage 206, the barcode reader 208, the in-vacuum robot (IVR) 210, the in-vacuum library (IVL) 212, the rapid exchange device (RED) 214, and the reticle stage (RS) 216. The laser beam 330 has a characteristic wavelength (or wavelengths) in order to differentiate the laser beam 330 from any background light.

A beam dump 340 reduces background light by absorbing light that passes through measurement volume 315 without significant deflection. The beam dump 340 has an open aperture through which the unscattered portion of beam 330 enters and an interior geometry that is generally configured for maximum absorption of the unscattered portion of laser beam 330.

Some of the light in the laser beam 330 which strikes a particle in the measurement volume 315 is scattered into detector 350 which measures the intensity of the scattered light. A photodetector 358 generates a signal indicating the intensity of the light collected and provides the signal to a signal processor 370. The signal processor 370 also identifies scattering events and provides to a computer 380 digital information describing variation in the analog signal because of the light scattered by the particles. The computer 380 analyzes the information from signal processor 370 to determine the size, position, and velocity of particles within measurement volume 315. A notification is then provided to an operator for taking corrective actions. In some embodiments, the corrective action includes stopping operation of the extreme ultraviolet lithography system 200 and cleaning the portions of the extreme ultraviolet lithography system 200 where the particles are detected. In some other embodiments, adjacent portions are also cleaned. In other embodiments, if the particle size is determined to be below a threshold value (baseline), then a corrective action is not taken. If the particle size is determined to be above the threshold value, then operation of the extreme ultraviolet lithography system 200 is ceased and a check (e.g., visual check) is performed to determine pellicle rupture. If pellicle rupture is determined, the section of the extreme ultraviolet lithography system 200 where the particles are detected is cleaned. In addition, one or more sections of the extreme ultraviolet lithography system 200 adjacent the section where particles are detected are also cleaned.

Figure 4:
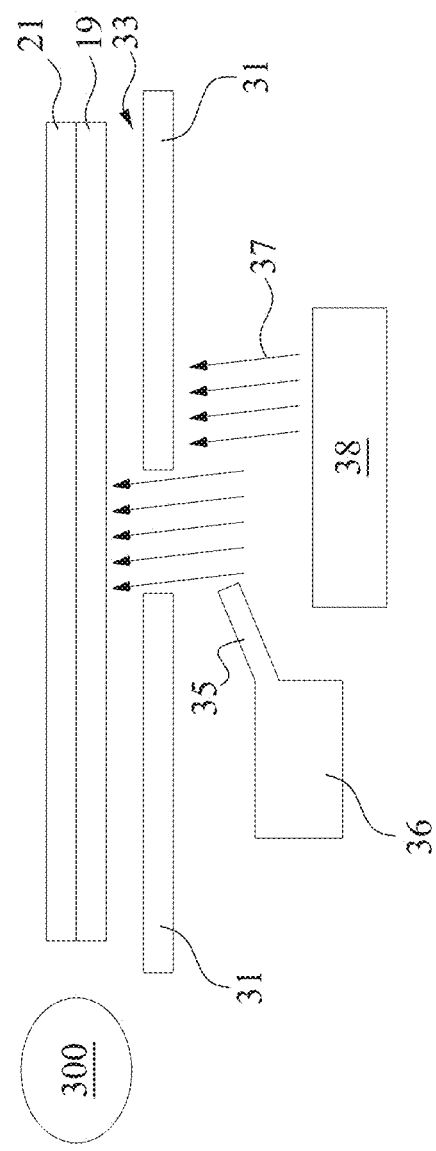
FIG. 4 schematically illustrates the reticle stage of the extreme ultraviolet lithography system including the particle counter of FIG. 3.

FIG. 4 schematically illustrates the reticle stage 216 of the extreme ultraviolet lithography system 200 including the particle counter 300. It should be understood that the location of particle counter 300 in FIG. 4 is just an example of a location where the particle counter 300 can be located, and that the particle counter 300 can be located at any desired location in and around the reticle stage 216.

As illustrated, the particle counter 300 is located adjacent the reticle 21 including the pellicle 19. REMA blades 31 are spaced from the pellicle 19 to define a space 33 between the REMA blades 31 and the pellicle 19. In an embodiment, an illumination uniformity correction module (UNICOM) 36 is located in front of (e.g. below) the REMA blades 31. The illumination uniformity correction module 36 includes a plurality of fingers 35 (one shown) for in the optical path of the EUV radiation 37 for illumination uniformity correction. In an embodiment, an illuminator top sleeve (ITS) 38 is located below the REMA blades 31. The illuminator top sleeve (ITS) 38 reduces particle transfer from the optics to the reticle 21. In an embodiment, the UNICOM 36 is positioned below the REMA blades 31. In an embodiment, the ITS 38 is positioned below the UNICOM 36 and the REMA blades 31. The REMA blades 31 control the shape of a projection beam of EUV radiation incident on the reticle 21.

Figure 5:
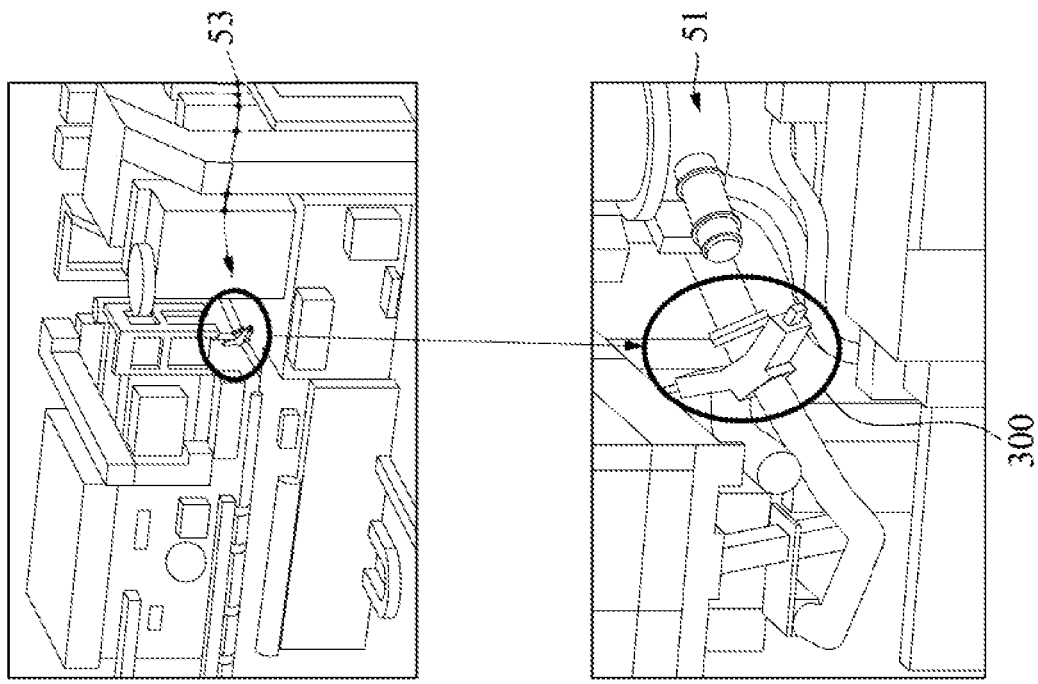
FIG. 5 illustrates the particle counter connected to one or more pumping systems of the extreme ultraviolet lithography system in FIG. 2.
Figure 5:
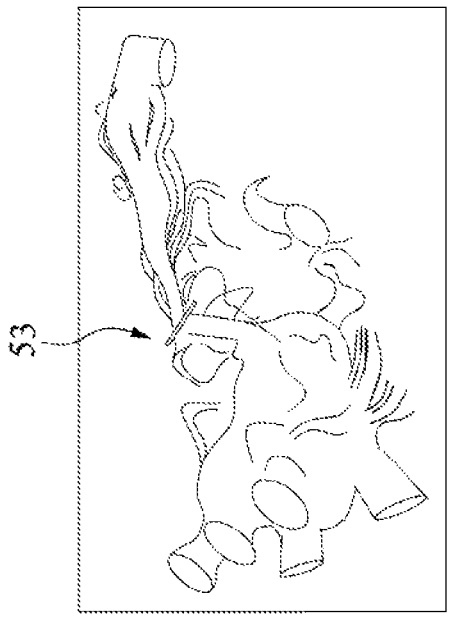

FIG. 5 illustrates the particle counter 300 connected to one or more pumping systems including, for example, a turbo molecular pump (TMP) 51. The pumping causes a gas flow (generally indicated at 53) including particles and the particle counter 300 counts the number of particles by using, for example, laser optics.

In some other embodiments, one or more of the sensors S1, S2, S3, S4, S5, and S6 include a microphone. The microphone is configured to detect sound that is generated when a pellicle breaks or ruptures. The microphone is calibrated with one or more frequencies of the sounds typically generated when a pellicle breaks. The microphone compares the detected sound with the one or more frequencies of the sounds. A match between the detected sound and the one or more calibrated frequencies indicates pellicle rupture. A notification is then provided to an operator to take the necessary corrective actions. The pressure inside the portion of the extreme ultraviolet lithography system 200 in vacuum environment is about 2 Pa to about 3 Pa. Thus, sounds caused by pellicle rupture can propagate in the extreme ultraviolet lithography system 200.

In other embodiments, one or more of the sensors S1, S2, S3, S4, S5, and S6 include an acoustic wave sensor. An acoustic wave that is generated when a pellicle breaks or ruptures is incident on the acoustic wave sensor. The acoustic wave modifies the surface acoustic wave of the acoustic wave sensor, and characteristics of the surface acoustic wave are modified. The change in the surface acoustic wave is used to quantify the phenomenon which caused the change, which in this case of the rupture of the pellicle. A notification is then provided to an operator to take the necessary corrective action.

Figure 6:
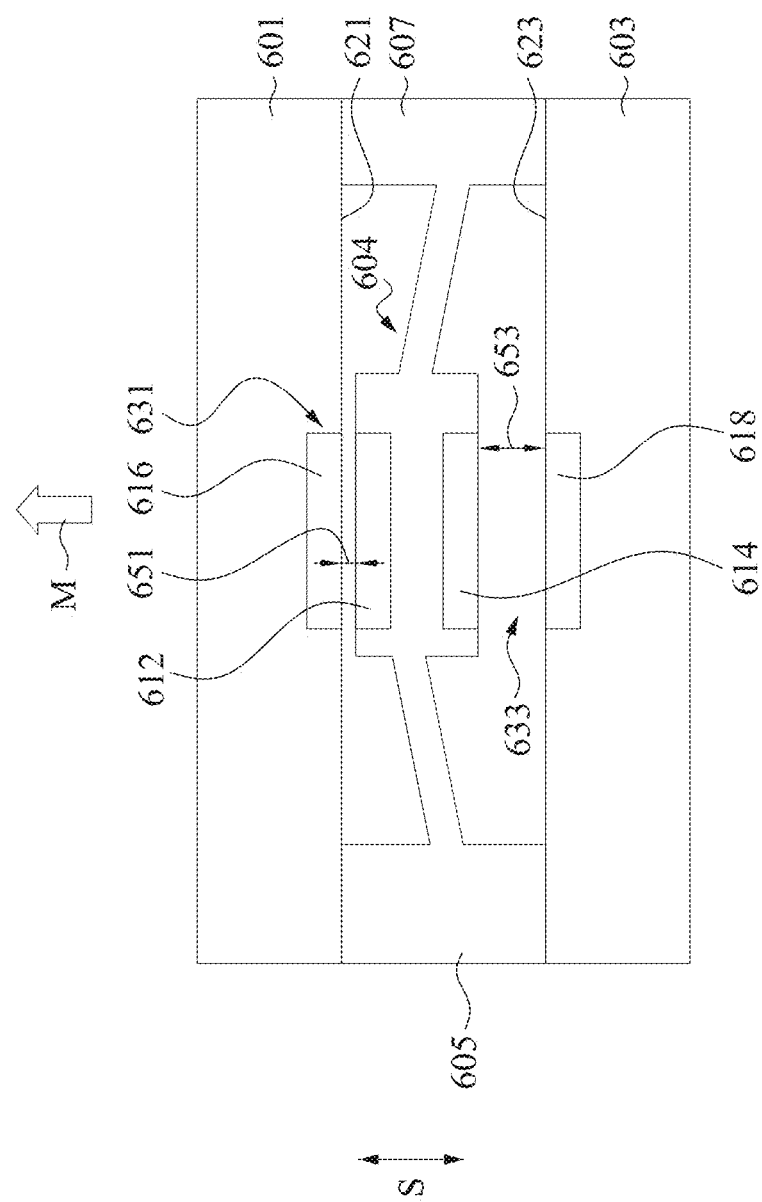
FIG. 6 schematically illustrates a G-force sensor.

FIG. 6 schematically illustrates a G-force sensor 600. The G-force sensor 600 (also referred to as an accelerometer) includes a seismic mass 604 sandwiched between two plates 601 and 603. In an embodiment, the plates 601 and 603 are glass plates. The seismic mass 604 is attached to supporting structures 605 and 607. The seismic mass 604 includes a first movable electrode 612 attached to on a first or "upper" surface of the seismic mass 604 and a second movable electrode 614 attached to a second or "lower" surface of the seismic mass 604. A first fixed electrode 616 is attached to the inner surface 621 of the plate 601 and opposite the first movable electrode 612. A second fixed electrode 618 is attached to the inner surface 623 of the plate 603 and opposite the second movable electrode 614. The first movable electrode 612 and the first fixed electrode 616 form a first capacitive element 631 in which the first movable electrode 612 and the first fixed electrode 616 are separated by a first gap 651. Similarly, the second movable electrode 614 and the second fixed electrode 618 form a second capacitive element 633 in which the second movable electrode 614 and the second fixed electrode 618 are separated by a second gap 653. The seismic mass 604 is configured to move along an axis of sensibility S and thereby move the first movable electrode 612 and the second movable electrode 614 with respect to the first fixed electrode 616 and the second fixed electrode 618. During operation, rupture of the pellicle 19 generates a force that acts on the seismic mass 604 and causes the seismic mass 604 to move along the axis of sensibility S. As an example, FIG. 6 illustrated a force acting on the seismic mass 604 in the direction M due to rupture of pellicle. Due to the force, the seismic mass 604 moves upward (with reference to the orientation in FIG. 6) and causes the gap 651 to decrease and the gap 653 to increase. A change in the gaps 651 and 653 changes the capacitance of the respective capacitive elements 631 and 633. The G-force sensor 600 detects the change in capacitance, and determines that the pellicle has ruptured. A notification is then provided to an operator to take the necessary corrective action.

Figure 7:
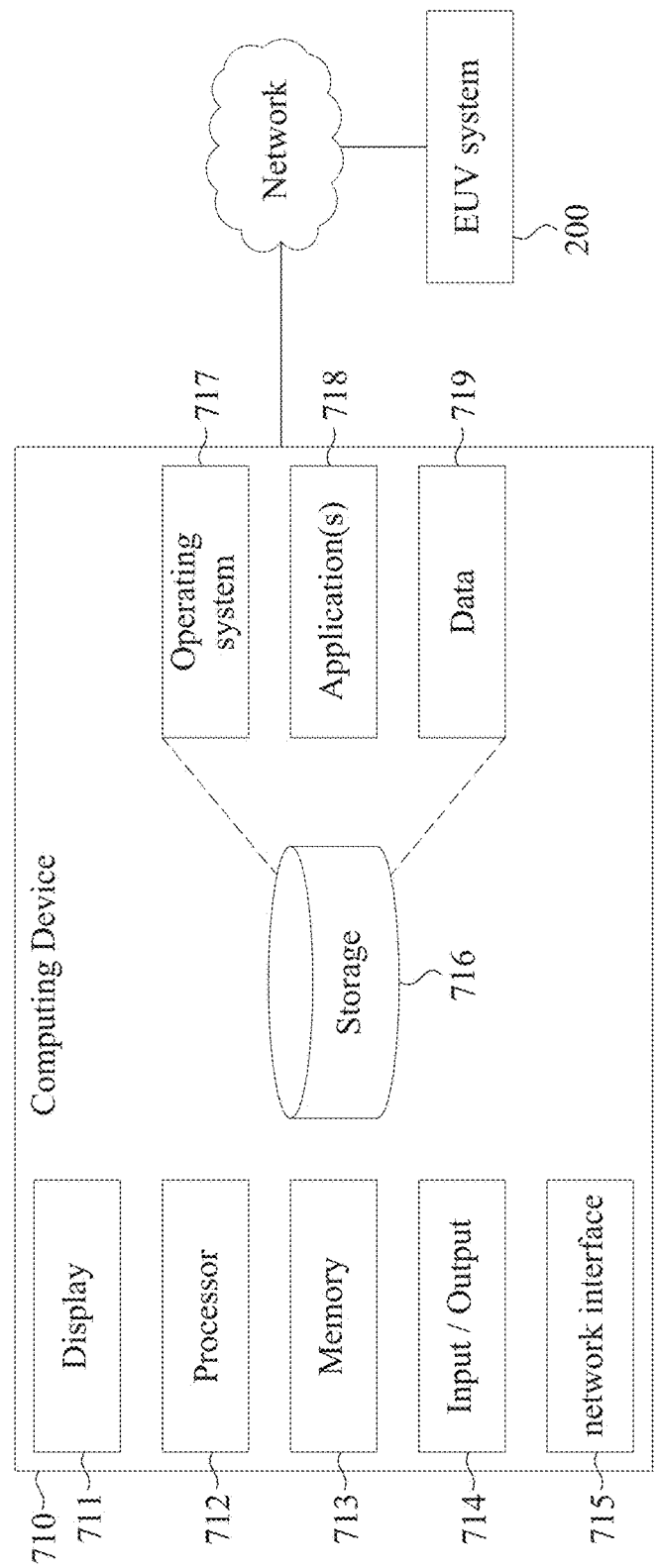
FIG. 7 is a block diagram illustrating an example computing device for controlling an operation of the extreme ultraviolet lithography system and the various sensors illustrated in FIG. 2, according to some embodiments.

FIG. 7 is a block diagram illustrating an example computing device 710 for controlling an operation of the extreme ultraviolet lithography system 200 illustrated in FIG. 2, according to some embodiments. In an embodiment, the computing device 710 controls the operation of the sensors S1, S2, S3, S4, S5, and S6 for detecting pellicle rupture. In some embodiments, the computing device 710 is implemented using hardware or a combination of software and hardware, either in a dedicated server, integrated into another entity, or distributed across multiple entities.

The computing device 710 is communicable connected to the extreme ultraviolet lithography system 200 using a wireless or wired network 740 to permit data exchange therebetween.

The computing device 710 includes a display 711, a processor 712, a memory 713, an input/output interface 714, a network interface 715, and a storage 716 storing an operating system 717, programs or applications 718 such as application for controlling the extreme ultraviolet lithography system 200 and sensors S1, S2, S3, S4, S5, and S6, and data 419. The processor 712 can be a general-purpose microprocessor, a microcontroller, a Digital Signal Processor (DSP), an Application Specific Integrated Circuit (ASIC), a Field-Programmable Gate Array (FPGA), a Programmable Logic Device (PLD), a controller, a state machine, gated logic, discrete hardware components, or any other suitable entity that can perform calculations or other manipulations of information. The storage 716 can be a Random Access Memory (RAM), a flash memory, a Read-Only Memory (ROM), a Programmable Read-Only Memory (PROM), an Erasable PROM (EPROM), registers, a hard disk, a removable disk, a CD-ROM, a DVD, or any other suitable storage device, for storing information and instructions to be executed by processor 710. The processor 710 and storage 716 can be supplemented by, or incorporated in, special purpose logic circuitry.

The network interface 715 includes networking interface cards, such as Ethernet cards and modems. In some embodiments, the input/output interface 714 is configured to connect to a plurality of devices, such as an input device and/or an output device. Example input devices include a keyboard and a pointing device, e.g., a mouse or a trackball, by which a user can provide input to the computing device 710. Other kinds of input devices are used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback; and input from the user can be received in any form, including acoustic, speech, tactile, or brain wave input. Example output devices include display devices, such as an LED (light emitting diode), CRT (cathode ray tube), or LCD (liquid crystal display) screen, for displaying information to the user.

The applications 718 can include instructions which, when executed by the computing device 710 (or the processor 712 thereof), causes the computing device 710 (or the processor 712 thereof) to control the extreme ultraviolet lithography system 200 and sensors S1, S2, S3, S4, S5, and S6, and perform other operations, methods, and/or processes that are explicitly or implicitly described in the present disclosure.

The data 719 can include data including default parameters used in the control operations, data that is received, for example, through the input/output interface 714 or through the network interface 715 transmitted from the extreme ultraviolet lithography system 200, data for displaying on the display 711, data that is transmitted to or from the extreme ultraviolet lithography system 200 via the network 740, or data generated during operation of the computing device 710.

An embodiment of the disclosure is an extreme ultraviolet (EUV) lithography system, including an extreme ultraviolet (EUV) radiation source to emit EUV radiation, a collector for collecting the EUV radiation and focusing the EUV radiation, a reticle stage for supporting a reticle including a pellicle for exposure to the EUV radiation, and at least one sensor configured to detect particles generated due to breakage of the pellicle. In an embodiment, the EUV lithography system further includes one or more of an out-of-vacuum robot (OVR) configured to provide the reticle to a load lock chamber, the load lock chamber configured to receive the reticle from the out-of-vacuum robot (OVR), in-vacuum robot (IVR) configured to transfer the reticle from the load lock chamber to an in-vacuum library (IVL) for storage, the in-vacuum library (IVL) configured to store the reticle, a rapid exchange device (RED) configured to provide the reticle to the reticle stage; and the at least one sensor located at or adjacent one or more of the out-of-vacuum robot (OVR), the in-vacuum robot (IVR), the load lock chamber, the in-vacuum library (IVL), the rapid exchange device (RED), and the reticle stage (RS). In an embodiment, the at least one sensor includes an acoustic wave sensor. In an embodiment, the at least one sensor includes a particle counter. In an embodiment, the at least one sensor includes a microphone. In an embodiment, the at least one sensor is positioned such that information regarding a broken pellicle is obtained prior to exposure of the reticle. In an embodiment, the EUV lithography system further includes a reticle backside inspection (RBI) stage configured to inspect a surface of the reticle for presence of pellicle particles.

An embodiment of the disclosure is a method of detecting status of a pellicle in an extreme ultraviolet (EUV) system that includes supporting a reticle for exposure to the EUV radiation using a reticle stage of the EUV system. The reticle includes a pellicle. A presence of particles in the EUV system is detected using at least one sensor. In the presence of particles, the reticle and pellicle in the EUV system are removed. The damaged pellicle is replaced. In an embodiment, the method further includes one or more of providing the reticle to a load lock chamber using an out-of-vacuum robot (OVR), receiving the reticle from the out-of-vacuum robot (OVR) using the load lock chamber, transferring the reticle from the load lock chamber to an in-vacuum library (IVL) for storage using in-vacuum robot (IVR), storing the reticle in the in-vacuum library (IVL), and providing the reticle to a reticle stage using a rapid exchange device (RED). The at least one sensor is provided at or adjacent one or more of the out-of-vacuum robot (OVR), the in-vacuum robot (IVR), the load lock chamber, the in-vacuum library (IVL), the rapid exchange device (RED), and the reticle stage (RS). In an embodiment, the at least one sensor includes an acoustic wave sensor, and the method includes detecting presence of particles in the EUV system using the acoustic wave sensor. In an embodiment, the at least one sensor includes a particle counter, and the method includes detecting presence of particles in the EUV system using the particle counter. In an embodiment, the at least one sensor includes a microphone and the method includes detecting presence of particles in the EUV system using the microphone. In an embodiment, the at least one sensor is positioned such that information regarding a damaged pellicle is obtained prior to exposure of the reticle. In an embodiment, the method further includes inspecting a backside surface of the reticle for presence of pellicle particles.

An embodiment of the disclosure is a method of detecting status of a pellicle in an extreme ultraviolet (EUV) system that includes transporting a reticle for exposure to the extreme ultraviolet (EUV) radiation in an extreme ultraviolet (EUV) lithography system. The reticle includes a pellicle installed thereon. A presence of particles in the EUV lithography system is detected using a first sensor of a plurality of sensors installed in the EUV lithography system. In the presence of particles, the first sensor is activated. A second sensor of the plurality of sensor is activated in response to activating the first sensor. In an embodiment, the first sensor includes a particle counter, and the reticle and pellicle are removed from the EUV lithography system when a number of particles detected by the first sensor is greater than a threshold value. The damaged pellicle is replaced. In an embodiment, the EUV lithography system includes a plurality of stages each providing a different functionality of the EUV lithography system and the second sensor located in the same stage as the first sensor. In an embodiment, the EUV lithography system includes a plurality of stages each providing a different functionality of the EUV lithography system, the second sensor is located in a different stage from the first sensor. In an embodiment, a third sensor of the plurality of sensors is activated. The first, second, third sensors are activated sequentially. In an embodiment, the plurality of sensors includes one of an acoustic wave sensor and a microphone.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) lithography system, comprising:
    an extreme ultraviolet (EUV) radiation source to emit EUV radiation;
    a collector for collecting the EUV radiation and focusing the EUV radiation;
    a reticle stage for supporting a reticle including a pellicle for exposure to the EUV radiation; and
    at least two sensors configured to detect particles generated due to breakage of the pellicle, wherein a first sensor of the at least two sensors is configured to activate a second sensor of the at least two sensors upon detection of particles.

2. The EUV lithography system of claim 1, further comprising:
    one or more of
        an out-of-vacuum robot (OVR) configured to provide the reticle to a load lock chamber,
        the load lock chamber configured to receive the reticle from the out-of-vacuum robot (OVR),
        in-vacuum robot (IVR) configured to transfer the reticle from the load lock chamber to an in-vacuum library (IVL) for storage,
        the in-vacuum library (IVL) configured to store the reticle,
        a rapid exchange device (RED) configured to provide the reticle to the reticle stage; and
    the at least two sensors located at or adjacent one or more of the out-of-vacuum robot (OVR), the in-vacuum robot (IVR), the load lock chamber, the in-vacuum library (IVL), the rapid exchange device (RED), and the reticle stage (RS).

3. The EUV lithography system of claim 1, wherein at least one of the first sensor and the second sensor includes an acoustic wave sensor.

4. The EUV lithography system of claim 1, wherein at least one of the first sensor and the second sensor includes a particle counter.

5. The EUV lithography system of claim 1, wherein at least one of the first sensor and the second sensor includes a microphone.

6. The EUV lithography system of claim 1, wherein at least one of the first sensor and the second sensor is positioned such that information regarding a broken pellicle is obtained prior to exposure of the reticle.

7. The EUV lithography system of claim 1, further comprising a reticle backside inspection (RBI) stage configured to inspect a surface of the reticle for presence of pellicle particles.

8. A method of detecting status of a pellicle in an extreme ultraviolet (EUV) system, comprising:
   supporting a reticle for exposure to the EUV radiation using a reticle stage of the EUV system, the reticle including a pellicle;
   detecting presence of particles in the EUV system using a first sensor of at least two sensors;
   activating a second sensor of the at least two sensors upon detection of particles;
   in the presence of particles, removing the reticle and pellicle in the EUV system; and
   replacing damaged pellicle.

9. The method of claim 8, further comprising:
   one or more of
      providing the reticle to a load lock chamber using an out-of-vacuum robot (OVR),
      receiving the reticle from the out-of-vacuum robot (OVR) using the load lock chamber,
      transferring the reticle from the load lock chamber to an in-vacuum library (IVL) for storage using in-vacuum robot (IVR),
      storing the reticle in the in-vacuum library (IVL), and
      providing the reticle to a reticle stage using a rapid exchange device (RED); and
      providing the at least two sensors at or adjacent one or more of the out-of-vacuum robot (OVR), the in-vacuum robot (IVR), the load lock chamber, the in-vacuum library (IVL), the rapid exchange device (RED), and the reticle stage (RS).

10. The method of claim 8, wherein at least one of the first sensor and the second sensor includes an acoustic wave sensor, and the method further comprises detecting presence of particles in the EUV system using the acoustic wave sensor.

11. The method of claim 8, wherein at least one of the first sensor and the second sensor includes a particle counter, and the method further comprises detecting presence of particles in the EUV system using the particle counter.

12. The method of claim 8, wherein at least one of the first sensor and the second sensor includes a microphone and the method further comprises detecting presence of particles in the EUV system using the microphone.

13. The method of claim 8, further comprising positioning at least one of the first sensor and the second sensor such that information regarding a damaged pellicle is obtained prior to exposure of the reticle.

14. The method of claim 8, further comprising inspecting a backside surface of the reticle for presence of pellicle particles.

15. A method comprising:
   transporting a reticle for exposure to the extreme ultraviolet (EUV) radiation in an extreme ultraviolet (EUV) lithography system, the reticle including a pellicle installed thereon;
   detecting presence of particles in the EUV lithography system using a first sensor of a plurality of sensors installed in the EUV lithography system;
   in the presence of particles, activating the first sensor; and
   activating a second sensor of the plurality of sensors in response to activating the first sensor.

16. The method of claim 15, wherein, the first sensor includes a particle counter, and the method further comprises:
   removing the reticle and pellicle from the EUV lithography system when a number of particles detected by the first sensor is greater than a threshold value; and
   replacing damaged pellicle.

17. The method of claim 15, wherein the EUV lithography system includes a plurality of stages each providing a different functionality of the EUV lithography system, and the method comprises:
   activating the second sensor located in the same stage as the first sensor.

18. The method of claim 15, wherein the EUV lithography system includes a plurality of stages each providing a different functionality of the EUV lithography system, and the method comprises:
   activating the second sensor located in a different stage from the first sensor.

19. The method of claim 15, further comprising activating a third sensor of the plurality of sensors, wherein the first, second, third sensors are activated sequentially.

20. The method of claim 15, wherein the plurality of sensors includes one of an acoustic wave sensor and a microphone.

* * * * *